(12) United States Patent
Oh

(10) Patent No.: US 9,704,911 B2
(45) Date of Patent: Jul. 11, 2017

(54) IMAGE SENSOR HAVING VERTICAL TRANSFER GATE FOR REDUCING NOISE AND ELECTRONIC DEVICE HAVING THE SAME

(71) Applicant: SK hynix Inc., Gyeonggi-do (KR)

(72) Inventor: Dongyean Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 20 days.

(21) Appl. No.: 14/609,152

(22) Filed: Jan. 29, 2015

(65) Prior Publication Data

US 2016/0150168 A1    May 26, 2016

(30) Foreign Application Priority Data

Nov. 21, 2014  (KR) .................. 10-2014-0163321

(51) Int. Cl.

| H04N 5/374 | (2011.01) |
|---|---|
| H01L 27/146 | (2006.01) |
| H04N 5/3745 | (2011.01) |

(52) U.S. Cl.
CPC .... *H01L 27/14645* (2013.01); *H01L 27/1464* (2013.01); *H01L 27/14612* (2013.01); *H01L 27/14643* (2013.01); *H04N 5/3745* (2013.01); *H01L 27/14621* (2013.01); *H01L 27/14627* (2013.01)

(58) Field of Classification Search
CPC ........... H01L 27/14645; H01L 27/1464; H01L 27/14643; H01L 27/14612; H01L 27/14621; H01L 27/14627; H04N 5/3745
USPC ................ 348/294, 302–304, 316, 321, 324
See application file for complete search history.

(56) References Cited

U.S. PATENT DOCUMENTS

| 7,364,960 B2 | 4/2008 | Lyu | |
|---|---|---|---|
| 2007/0252182 A1* | 11/2007 | Beck | ................ H01L 27/14609 257/292 |
| 2012/0199882 A1 | 8/2012 | Shin | |
| 2012/0257092 A1* | 10/2012 | Sa | .......................... H04N 5/355 348/302 |
| 2014/0211056 A1* | 7/2014 | Fan | ................... H01L 27/14643 348/308 |

FOREIGN PATENT DOCUMENTS

| KR | 100647514 | 11/2006 |
|---|---|---|
| KR | 102012012560 | 11/2012 |

* cited by examiner

*Primary Examiner* — Hung Lam
(74) *Attorney, Agent, or Firm* — IP & T Group LLP

(57) ABSTRACT

An image sensor may include: a photoelectric conversion element; a transfer gate formed over the photoelectric conversion element; a plurality of active pillars electrically coupled to the photoelectric conversion element by penetrating the transfer gate; a reset transistor coupled to the plurality of active pillars; and a source follower transistor having a gate electrically coupled to one or more active pillars among the plurality of active pillars.

26 Claims, 9 Drawing Sheets

IMAGE SENSOR HAVING VERTICAL TRANSFER GATE FOR REDUCING NOISE AND ELECTRONIC DEVICE HAVING THE SAME

CROSS-REFERENCE TO RELATED APPLICATIONS

The present document claims priority of Korean Patent Application No. 10-2014-0163321, entitled "IMAGE SENSOR HAVING VERTICAL. TRANSFER GATE AND ELECTRONIC DEVICE HAVING THE SAME" and filed on Nov. 21, 2014, which is incorporated herein by reference in its entirety.

BACKGROUND

Exemplary embodiments of the present invention relate to a semiconductor device fabrication technology, and more particularly, to an image sensor having a vertical transfer gate and an electronic device having the same.

An image sensor is a device that converts air optical image into an electrical signal. Recently, with the development of the computer industry and communication industry, the demand image sensors with improved performance has increased in various fields such as digital cameras, camcoders, Personal Communication Systems (PCS), game machines, security cameras, medical micro cameras, and robots.

SUMMARY

Various embodiments are directed to an image sensor with improved performance, and an electronic device having the same.

In an embodiment, an image sensor may include: a photoelectric conversion element; a transfer gate formed over the photoelectric conversion element; a plurality of active pillars electrically coupled to the photoelectric conversion element by penetrating the transfer gate; a reset transistor coupled to the plurality of active pillars; and a source follower transistor having a gate electrically coupled to one or more active pillars among the plurality of active pillars. The image sensor may further include: a color filter layer formed over an incident surface over which incident light is introduced into the photoelectric conversion element; and a micro lens formed over the color filter.

The transfer gate may include: a gate electrode formed over the photoelectric conversion element; and a charge blocking layer interposed between the gate electrode and the photoelectric conversion element and between the gate electrode and the plurality of active pillars. The gate electrode may surround all sidewalls of the plurality of active pillars. Furthermore, the gate electrode may include: a first gate electrode surrounding all sidewalls of a first group of the plurality of active pillars, wherein the first group includes the one or more active pillars coupled to the gate of the source follower transistor; and a second gate electrode surrounding all sidewalls of a second group of the plurality of active pillars different from the first group. The transfer gate may be formed over a surface opposite to an incident surface through which incident light is introduced into the photoelectric conversion element.

The reset transistor may include: a first reset transistor electrically coupled to a first group of the plurality of active pillars, wherein the first group includes the one or more active pillars coupled to the gate of the source follower transistor; and a second reset transistor electrically coupled to a second group of the plurality of active pillars, different from the first group.

Each of the active pillars may have a critical dimension at which the active pillar is fully depleted in an equilibrium state. Each of the active pillars may include: a channel region coupled to the photoelectric conversion element, and surrounded by the transfer gate; and a floating diffusion region coupled to the channel region, and protruding over the transfer gate. Furthermore, the channel region may have an undoped state in which the channel region is not doped with an impurity. Furthermore, the channel region may have a doped state in which the channel region is doped with an impurity, have the same conductivity type as the floating diffusion region, and have an impurity doping concentration lower than the floating diffusion region.

The photoelectric conversion element may include first and second impurity regions that vertically overlap each other and have different conductivity types, and the first impurity region may be electrically coupled to the plurality of active pillars.

In an embodiment, an image sensor may include: a photoelectric conversion element; a plurality of active pillars formed over the photoelectric conversion element, and electrically coupled to the photoelectric conversion element; a transfer gate formed over the photoelectric conversion element to surround the plurality of active pillars; a first reset transistor electrically coupled to a first group of the plurality of active pillars; and a second reset transistor electrically coupled to a second group of the plurality of active pillars, different from the first group. The image sensor may further include a source follower transistor having a gate electrically coupled to the first group of the active pillars.

The transfer gate may include: a gate electrode formed over the photoelectric conversion element; and a charge blocking layer interposed between the gate electrode and the photoelectric conversion element and between the gate electrode and the plurality of active pillars. The gate electrode may surround all sidewalls of the plurality of active pillars. Furthermore, the gate electrode may include: a first gate electrode surrounding all sidewalls of the first group of the plurality of active pillars; and a second gate electrode surrounding all sidewalls of the second group of the plurality of active pillars. The transfer gate may be formed over a surface opposite to an incident surface through which incident light is introduced into the photoelectric conversion element.

Each of the plurality of active pillars may have a critical dimension at which the active pillar is fully depleted in an equilibrium state. Each of the plurality of active pillars may include: a channel region coupled to the photoelectric conversion element, and surrounded by the transfer gate; and a floating diffusion region coupled to the channel region, and protruding over the transfer gate. The channel region may have an undoped state in which the channel region is not doped with an impurity. The channel region may have a doped state in which the channel region is doped with an impurity, have the same conductivity as the floating diffusion region, and have an impurity doping concentration lower than the floating diffusion region.

The photoelectric conversion element may include first and second impurity regions which vertically overlap each other and have different conductivity types, and the first impurity region may be electrically coupled to the plurality of active pillars.

In an embodiment, an image sensor may include: a photoelectric conversion element; first and second transfer units sharing the photoelectric conversion element, and each including one or more transfer transistors coupled in parallel; a first reset transistor coupled to the first transfer unit; a source follower transistor having a gate coupled to a floating diffusion node between the first transfer unit and the first reset transistor; and a second reset transistor coupled to the second transfer unit.

The first and second transfer units may be turned on/off in response to the same transfer signal, and the first and second reset transistors may be turned on/off in response to the same reset signal.

The first and second transfer units are turned on/off in response to a different transfer signal, and the first and second reset transistors may be turned on/off in response to the same reset signal.

In an embodiment, an electronic device may include: an optical lens; an image sensor having a plurality of unit pixels; and a signal processing circuit suitable for processing an output signal from the image sensor. Each of the plurality of unit pixels may include: a photoelectric conversion element; a transfer gate formed over the photoelectric conversion element; a plurality of active pillars electrically coupled to the photoelectric conversion element by penetrating the transfer gate; a reset transistor coupled to the plurality of active pillars; and a source follower transistor having a gate electrically coupled to one or more active pillars among the plurality of active pillars.

DETAILED DESCRIPTION

Figure 1:
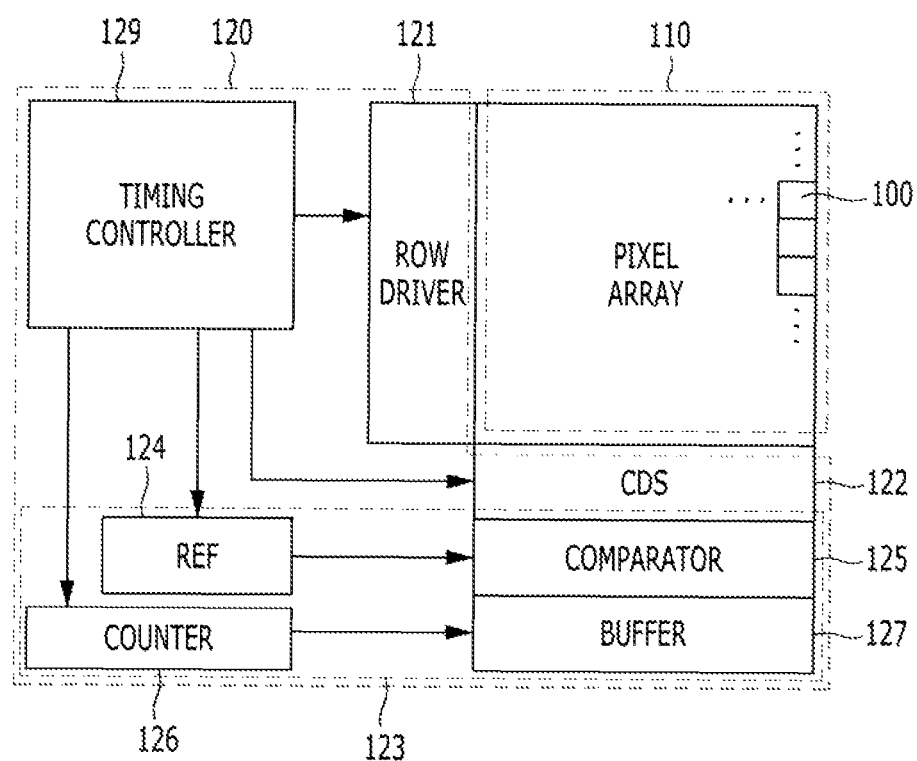
FIG. 1 is a block diagram illustrating an image sensor including unit pixels in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also where a third layer exists between the first layer and the second layer or the substrate.

Image sensors that convert optical images into electrical signals may be divided into Charge Coupled Devices (CCD) and CMOS Image Sensors (CIS). CMOS Image Sensors (CIS) may reduce fabrication cost because of their simple driving method and compatibility with the CMOS process technology. Thus, the CIS will be taken as an example for describing the following embodiments. The CIS may transfer a photocharge generated by a photoelectric conversion element to a floating diffusion region through a transfer transistor. The transfer transistor may include a channel region, which is doped with a predetermined impurity, in order to improve the gate controllability or on/off characteristics of the transfer gate. As an NMOS transistor is generally used as the transfer transistor, the channel region of the transfer transistor may be doped with a P-type impurity.

Recently, a vertical transfer gate has been proposed in order to further improve the gate controllability or on/off characteristics of the transfer transistor. In order to implement the vertical transfer gate, the channel region inevitably has a vertical structure. Thus, as the size of a unit pixel decreases, the doping process for doping the channel region with an impurity becomes more complicated and degrades productivity. Furthermore, random dopant fluctuation (RDF) of the doping impurity may deepen to increase the signal-to-noise ratio (SNR). Moreover, the transfer transistor with the vertical transfer gate may reduce the area (or capacitance) of the floating diffusion region, thereby further increasing the SNR.

Thus, the following embodiments of the present invention may prevent increases in the SNR of image sensors with vertical transfer gates, and provide image sensors with improved performance and an electronic device having the same.

FIG. 1 is a block diagram illustrating an image sensor including unit pixels in accordance with an embodiment of the present invention.

As illustrated in FIG. 1, the image sensor in accordance with the embodiment of the present invention may include a pixel array 110 and a signal processor 120. The pixel array 110 may generate an electrical signal in response to incident light. The pixel array 110 may include a plurality of unit pixels 100, which are two-dimensionally arranged in a matrix shape. The physical structure and circuit structure of the unit pixel 100 will be described below.

The signal processor 120 may generate image data by processing the electrical signal generated from the pixel array 110. The signal processor 120 may include a row driver 121, a correlated coupling sampler (CDS) 122, an analog-to-digital converter (ADC) 123, and a timing controller 129.

The row driver 121 may be coupled to each row of the pixel array 110, and generate a driving signal for driving each row. For example, the row driver 121 may drive the plurality of unit pixels 100 included in the pixel array 110 on a row basis.

The CDS 122 may perform correlated double sampling by calculating a difference between a reference voltage, indicating a reset state of the unit pixel 100, and an output voltage, indicating a signal component corresponding to the incident light using a capacitor, a switch or the like, and output an analog sampling signal corresponding to a valid signal component. The CDS 122 may include a plurality of CDS circuits, each of which is coupled to a corresponding one of the column lines of the pixel array 110, and outputs the analog sampling signal corresponding to the valid signal component at each column.

The ADC 123 may convert the analog sampling signal corresponding to the valid signal' component into a digital image signal. The ADC 123 may include a reference signal generator 124, a comparator 125, a counter 126, and a buffer 127. The reference signal generator 124 may generate a ramp signal having a constant slope, and provide the ramp signal as a reference signal to the comparator 125. The comparator 125 may compare the analog sampling signals outputted from the CDS 122 at the respective columns with the ramp signal generated from the reference signal generator 124, and output comparison signals having transition times based on the valid signal components. The counter 125 may generate a counting signal by performing a counting operation, and provide the counting signal to the buffer 127. The buffer 127 may include a plurality of latch circuits coupled to the respective column lines, latch the counting signal outputted from the counter 126 at the respective columns in response to the transition times of the respective comparison signals, and output the latched counting signal as the digital image data.

Depending on an embodiment, the ADC 123 may further include an adder circuit configured to receive the analog sampling signals outputted from the CDS 122. The buffer 127 may further include a plurality of signal line buffers.

The timing controller 129 may control operation timings of the row driver 121, the CDS 122, and the ADC 123. The timing controller 129 may provide a timing signal and a control signal to the row driver 121, the CDS 122, and the ADC 123.

Referring to FIG. 1, it has been described that the image sensor performs analog double sampling. Depending on the embodiment, however, the image sensor may perform digital double sampling (DDS). In digital double sampling, an analog signal for a signal component and an analog signal for a reset component are converted into digital signals when a pixel is reset, and a difference between the two digital signals is extracted as a valid signal component.

Referring to FIGS. 2, 3A, 36, and 4A to 4F, an image sensor in accordance with a first embodiment will be described in detail. First, referring to FIG. 2, a circuit configuration and an operation of the image sensor in accordance with the first embodiment will be described.

Figure 2:
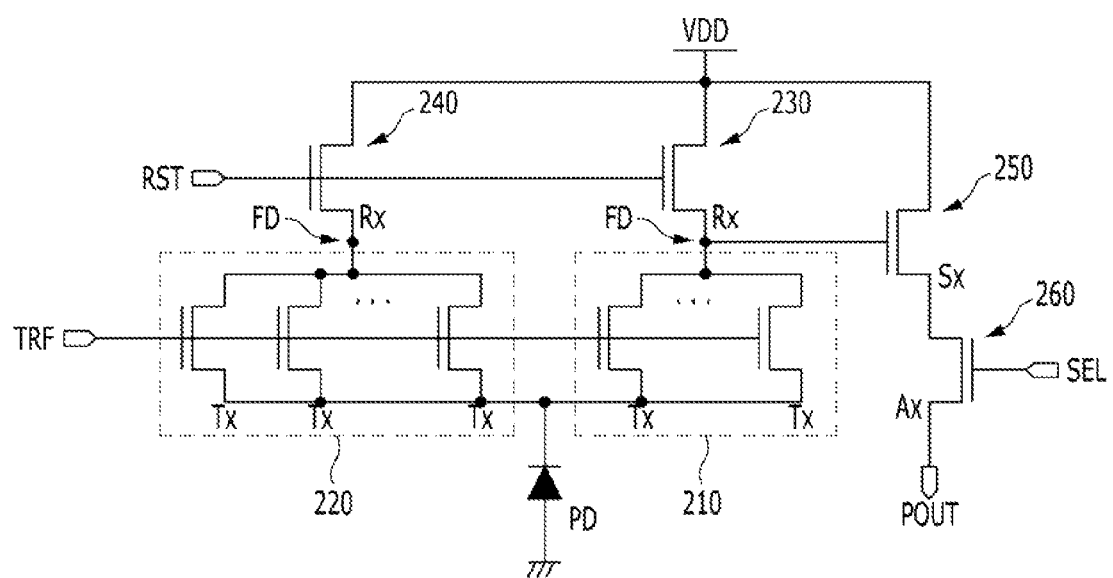
FIG. 2 is an equivalent circuit diagram illustrating a unit pixel of an image sensor in accordance with a first embodiment.

FIG. 2 is an equivalent circuit diagram illustrating a unit pixel of the image sensor in accordance with the first embodiment.

As illustrated in FIG. 2, the unit pixel of the image sensor in accordance with the first embodiment may include a photoelectric conversion element PD, a transfer transistor Tx, a reset transistor Rx, a source follower transistor (Sx) 250, and an access transistor (Ax) 260. The unit pixel may include a plurality of transfer transistors Tx, and each of first and second transfer units 210 and 220 may include one or more transfer transistors Tx. The reset transistor Rx may include a first reset transistor 230 coupled to the first transfer unit 210, and a second reset transistor 240 coupled to the second transfer unit 220.

The photoelectric conversion element. PD may include a photodiode. The photoelectric conversion element PD may be coupled between a ground voltage terminal and a common node of the first and second transfer units 210 and 220.

For example the plurality of transfer transistors Tx included in the first and second transfer units 210 and 220 may be coupled between the photoelectric conversion element PD and a floating diffusion node FD. The first and second transfer units 210 and 220 may be configured to share one photoelectric conversion element PD. Each of the transfer transistors Tx included in the first and second transfer units 210 and 220 may have the same shape or operation characteristics. Furthermore, the floating diffusion node FD may be coupled to one side of the reset transistor Rx.

Each of the first and second transfer units 210 and 220 may include one or more transfer transistors Tx coupled in parallel. The number of transfer transistors Tx included in the first or second transfer unit 210 or 220 may be adjusted according to a target characteristic. In particular, the sensitivity and SNR characteristics of the image sensor may be controlled by adjusting the number of transfer transistors Tx included in the first transfer unit 210. For example, when it is assumed that the first transfer unit 210 includes five transfer transistors Tx, the SNR characteristics may be improved by increasing the number of transfer transistors Tx to six or more. On the other hand, the sensitivity may be improved by decreasing the number of transfer transistors Tx to four or less.

The first and second transfer units 210 and 220 may operate in response to a transfer signal TRF. That is, the plurality of transfer transistors Tx included in the first and second transfer units 210 and 220 may be configured to share one transfer gate, or the transfer gates of the plurality of transfer transistors Tx may be coupled to one conductive line, for example, one transfer line.

The first reset transistor 230 may be coupled between the first transfer unit 210 and a power supply voltage (VDD) terminal, and the second reset transistor 240 may be coupled between the second transfer unit 220 and the VDD terminal. The first and second reset transistors 230 and 240 may operate in response to a reset signal RST. For example, a gate of the first reset transistor 230 and a gate of the second reset transistor 240 may be coupled to one conductive line, for example, one reset line.

The source follower transistor 250 may be coupled between the VDD terminal and the access transistor 260, and have a gate coupled to the first transfer unit 210 at the floating diffusion node FD. That is, the source follower transistor 250 may not be coupled to the floating diffusion node FD that is coupled to the second transfer unit 220. Thus, the sensitivity and SNR of the image sensor may be controlled by adjusting the number of transfer transistors Tx included in the first transfer unit 210.

The access transistor 260 may be coupled between the source follower transistor 250 and an output terminal through which a pixel signal POUT may be outputted.

Referring to FIG. 2, a method for driving the unit pixel of the image sensor in accordance with the first embodiment will be described as follows.

First, the transfer signal TRF may be applied to the first and second transfer units 210 and 220 in a state where incident light is blocked, and the reset signal RST may be applied to turn on the first and second reset transistors 230 and 240. As the first and second transfer units 210 and 220 and the first and second reset transistors 230 and 240 are turned on to discharge the floating diffusion nodes FD, the floating diffusion nodes FD may be reset. The transfer signal TRF and the reset signal RST may include a pulse signal for controlling turn on/off of a transistor.

Then, the first and second transfer units 210 and 220 and the first and second reset transistors 230 and 240 may be turned off, and light may be incident on the photoelectric conversion element PD for a predetermined time. The photoelectric conversion element PD may generate an electron-hole pair (EHP), that is, a photocharge using the incident light, and the generated photocharge may be accumulated in the photoelectric conversion element PD. The time during which the photocharge is accumulated in the photoelectric conversion element may be referred to as an integration time of the photoelectric conversion element PD.

Even after the floating diffusion node FD is reset, the reset signal RST may be continuously applied to maintain the turn-on state of the first and second reset transistors 230 and 240 during the integration time. In this case, it is possible to prevent a charge from remaining in the floating diffusion node FD while the floating diffusion node FD is not reset. Furthermore, it is possible to prevent a change in potential of the floating diffusion node FD during the integration time. For reference, when the potential of the floating diffusion node FD is changed during the integration time, the SNR characteristics may be degraded.

Then, while the first and second reset transistors 230 and 240 are turned off, the transfer signal TRF may be applied to transfer the photocharges accumulated in the photoelectric conversion element PD to the floating diffusion node FD during the integration time. In proportion to the photocharges transferred to the floating diffusion node FD, a bias inputted to the gate of the source follower transistor 250 may be changed, and a source potential of the source follower transistor 250 may vary. Both of the first and second transfer units 210 and 220 may be turned on in response to the transfer signal TRF. However, since the gate of the source follower transistor 250 is coupled to the floating diffusion node FD that is coupled to the first transfer unit 210, the source potential of the source follower transistor 250 may vary in response to only the photocharge transferred to the floating diffusion node FD through the first transfer unit 210.

When the access transistor 260 is turned on in response to a select signal SEL in a state in which the source potential of the source follower transistor 250 varies, the pixel signal POUT may be outputted. The select signal SEL may include a pulse signal for controlling turn on/off of a transistor.

In the above-described image sensor in accordance with the first embodiment, each of the first and second transfer units 210 and 220 may include one or more transfer transistors Tx coupled in parallel to each other, thereby improving transfer efficiency for the photocharge generated by the photoelectric conversion element PD.

Furthermore, as the source follower transistor 250 is coupled only to the floating diffusion node FD that is coupled to the first transfer unit 210, the number of transfer transistors Tx included in the first transfer unit 210 may be adjusted to improve the sensitivity and SNR of the image sensor.

Figure 3A:
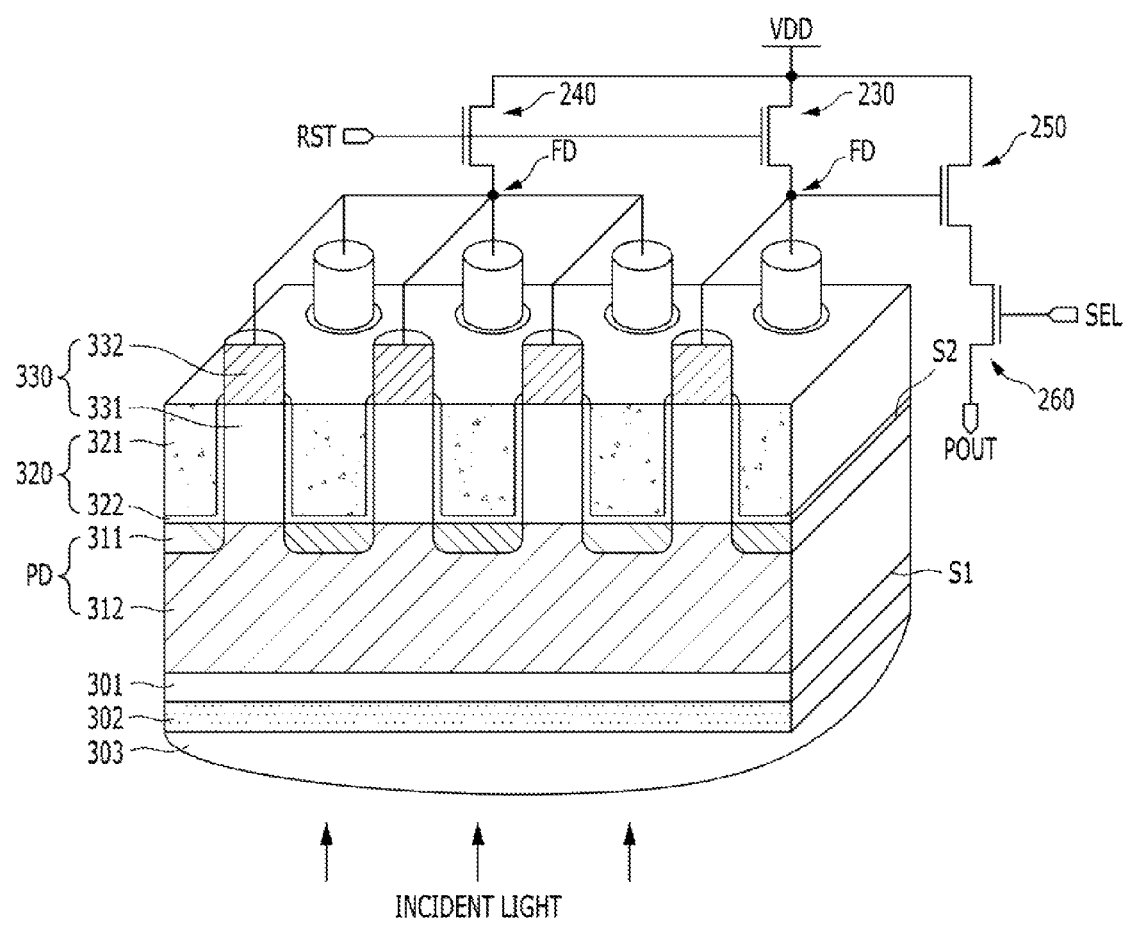
FIG. 3A is a perspective view illustrating a unit pixel of the image sensor in accordance with the first embodiment of the present invention.
Figure 3B:
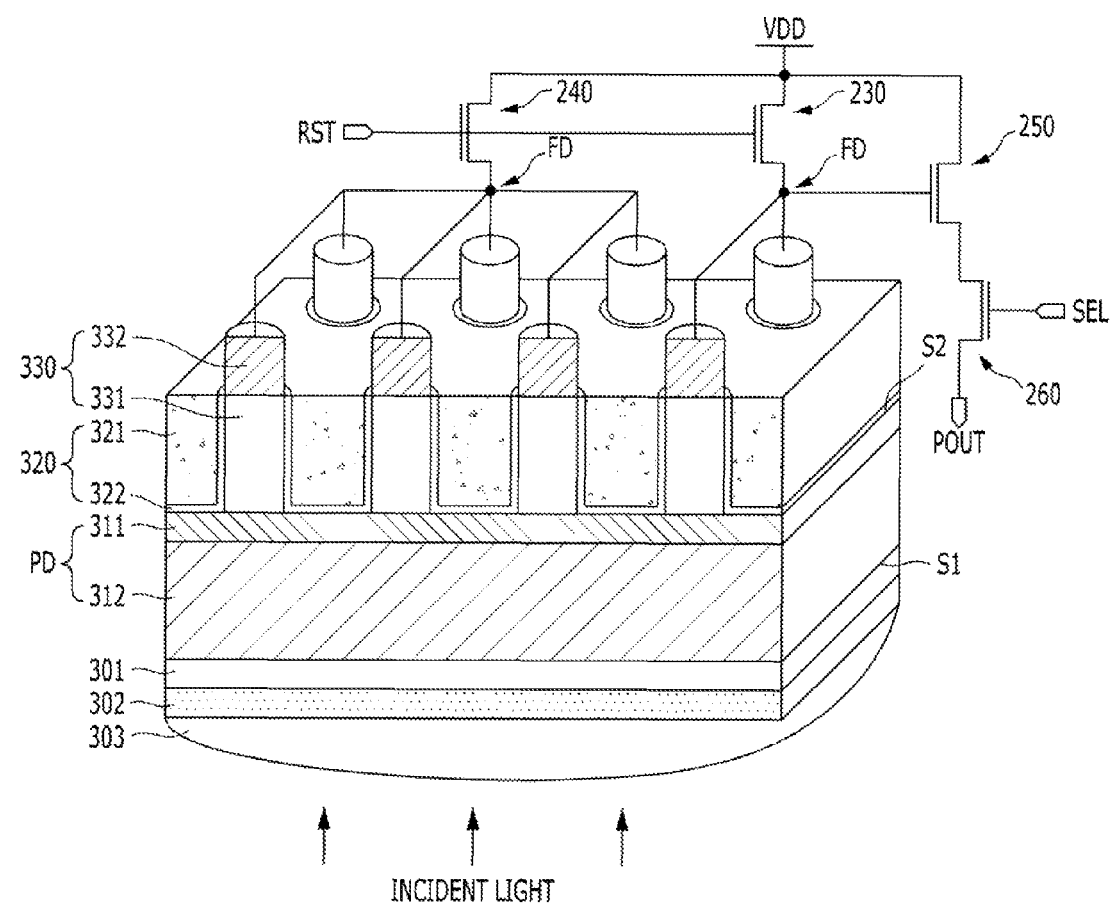
FIG. 3B is a perspective view illustrating a unit pixel of an image sensor in accordance with the present invention.
Figure 4A:
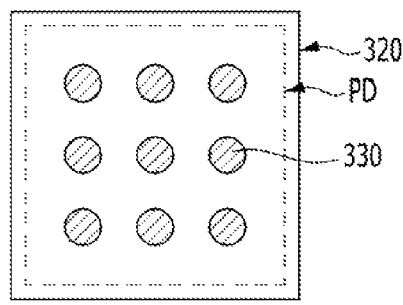
FIGS. 4A to 4F are plan views illustrating modifications for shapes of a plurality of active pillars in the unit pixel of an image sensor in accordance with the first embodiment.
Figure 4B:
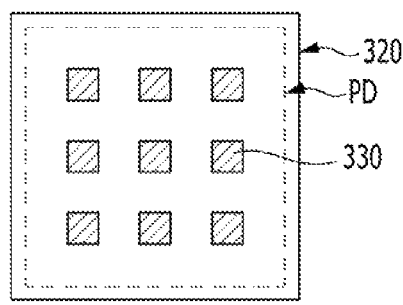
Figure 4C:
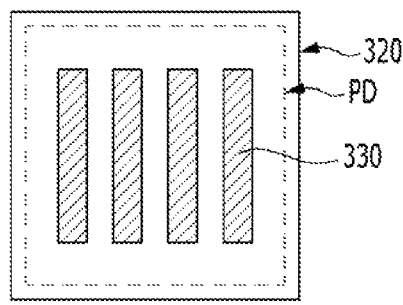
Figure 4D:
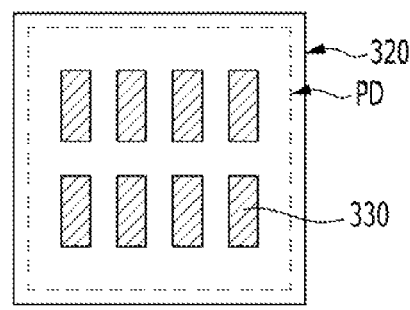
Figure 4E:
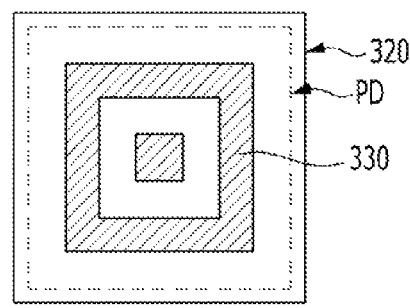
Figure 4F:
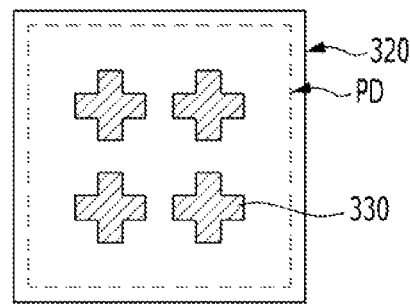

The structure of an image sensor having the above-described equivalent circuit will be described in detail with reference to FIGS. 3A, 3B, and 4A to 4F. FIG. 3A is a perspective view illustrating a unit pixel of an image sensor in accordance with the first embodiment of the present invention, and FIG. 3B is a perspective view illustrating a unit pixel of an image sensor in accordance with a modification of the present invention. FIGS. 3A and 3B include cross-sectional views illustrating unit pixels. FIGS. 4A to 4F are plan views illustrating modifications for the shapes of a plurality of active pillars in a unit pixel of the image sensor in accordance with the first embodiment.

As illustrated in FIGS. 3A and 3B, the unit pixel of the image sensor in accordance with the first embodiment may include a photoelectric conversion element PD, a transfer gate 320, a plurality of active pillars 330, a first reset transistor 230, a second reset transistor 240, and a source follower transistor 250. The transfer gate 320 may be formed over the photoelectric conversion element. PD. The plurality of active pillars 330 may be electrically coupled to the photoelectric conversion element PD by penetrating the transfer gate 320. The plurality of active pillars 330 may be divided into a first group including one or more active pillars 330 among the plurality of active pillars 330, and a second group different from the first group. The first reset transistor 230 may be electrically coupled to the first group of the plurality of active pillars 330. The second reset transistor 240 may be electrically coupled to the second group of the plurality of active pillars 330. The source follower transistor 250 may have a gate electrically coupled to the first group of the active pillars 330. The unit pixel of the image sensor may further include a color filter layer 302 formed over an incident surface S1 through which incident light is introduced into the photoelectric conversion element PD, and a micro lens 303 formed on the color filter layer 302.

The photoelectric conversion element PD may be formed in a substrate 301 or formed over the substrate 301. The photoelectric conversion element PD may have a plate shape corresponding to the planar shape of the unit pixel. The substrate 301 may include a semiconductor material. Specifically, the substrate 301 may have a single crystal state and include a silicon-containing material.

The photoelectric conversion element PD may include a photodiode. The photodiode may include one or more photoelectric conversion units which are formed in the substrate 301 to vertically overlap each other, or an organic photoelectric conversion layer (not illustrated) formed on the substrate 301. In the present embodiment, the photoelectric conversion element PD may include one or more photoelectric conversion units, which are formed in the substrate 301, so as to vertically overlap each other. The photoelectric conversion unit may include a first impurity region 311 having a P-type conductivity and a second impurity region 312 having an N-type conductivity. The first and second impurity regions 311 and 312 may be formed by ion-implanting impurities into the substrate 301. The second impurity region 312 may serve as a junction region of the transfer transistor Tx.

Referring to FIG. 3A, the first impurity region 311 may be formed in the substrate 301 between the respective active pillars 330 so as not to overlap the active pillars 330. In this case, each of the active pillars 330 may not be electrically coupled to the first impurity region 311. Referring to FIG. 3B, the first impurity region 311 may be formed on the entire surface of the substrate 301 to overlap the plurality of active pillars 330. In this case, each of the active pillars 330 may be electrically coupled to the first impurity region 311. For reference, although the first impurity region 311 of FIG. 3A is formed to overlap the plurality of active pillars 330, the structure of FIG. 3A may have similar characteristics to the structure of FIG. 3B, in which the first impurity region 311 does not overlap the plurality of active pillars 330. This is because the first impurity region 311 has a reduced thickness and lower impurity doping concentration than the other impurity regions contacted with the first impurity region 311.

The transfer gate 320 may be formed on an opposite surface S2 of the incident surface S1 through which the incident light is introduced into the photoelectric conversion element PD. The transfer gate 320 may be formed in a plate shape over the photoelectric conversion element PD. At this time, as shown in FIGS. 4A to 4F, the transfer gate 320 may have a shape to cover the opposite surface S2 of the photoelectric conversion element PD. The transfer gate 320 may serve as a reflecting layer which reflects the incident light, escaping to the outside, through the photoelectric conversion element PD, on the photoelectric conversion element PD, thereby increasing quantum efficiency of the photoelectric conversion element PD. Thus, as the transfer gate 320 has a shape to cover the opposite surface S2 of the photoelectric conversion element PD, the quantum efficiency of the photoelectric conversion element PD may be effectively increased. The transfer gate 320 may include a metallic material to serve as a reflecting layer.

The transfer gate 320 may include a gate electrode 321 and a charge blocking layer 322. The gate electrode 321 may be formed over the photoelectric conversion element PD so as to surround all the sidewalls of the plurality of active pillars 330, and the charge blocking layer 322 may be interposed between the gate electrode 321 and the photoelectric conversion element PD and between the gate electrode 321 and the plurality of active pillars Since the plurality of active pillars 330 are surrounded by one gate electrode 321, all of the transfer transistors Tx may operate in response to the transfer signal TRF. The gate electrode 321 may include a metallic material, and the charge blocking layer 322 may include an insulating material.

Each of the active pillars 330 may include a channel region 331 and a floating diffusion region 332. The channel region 331 may be electrically coupled to the photoelectric conversion element PD and surrounded by the transfer gate 320, and the floating diffusion region 332 may be electrically coupled to the channel region 331 so as to protrude over the transfer gate 320.

Each of the active pillars 330 may include the same material as the substrate 301. For example, each of the active pillars 330 may be formed by etching the substrate 301, and include a single-crystal silicon-containing material. Each of the active pillars 330 may have various shapes. For example, referring to FIGS. 4A to 4F, each of the active pillars 330 may have various geometrical shapes such as a rectangular pillar, a polygonal pillar, a circular pillar, an elliptical pillar, a donut-shaped pillar, and a cross-shaped pillar. At this time, each of the active pillars 330 may have the same shape or different shapes. As such, each of the active pillars 330 having various shapes may have a critical dimension (CD) at which the channel region 331 can be fully depleted in a state where the transfer transistor Tx is turned off. The turn-off state of the transfer transistor Tx may indicate an equilibrium state in which no bias is applied to the transfer gate 320. For example, when each of the active pillars 330 has a cylindrical shape, i.e., a circular pillar, the circular pillar may have a diameter of 30 nm or less so as to be fully depleted. This is in order to prevent the occurrence of leakage current in a turn-off state of the transfer transistor Tx. That is, the occurrence of noise may be prevented to improve the SNR characteristics.

The floating diffusion region 332 may correspond to an impurity region formed over each of the active pillars 330. One or more floating diffusion regions 332 may be coupled to each other to serve as a floating diffusion node FD. That is, the plurality of active pillars 330, each including the floating diffusion region 332, may be divided into the first group, coupled to the first reset transistor 230, and the second group, coupled to the second reset transistor 240. One or more floating diffusion regions 332, coupled to the first reset transistor 230, may serve as the floating diffusion node FD for controlling turn on/off of the source follower transistor 250. The floating diffusion region 332 may have the same conductivity type as the second impurity region 312 of the photoelectric conversion element PD. For example, the floating diffusion region 332 may include an N-type impurity region doped with an N-type impurity.

In each of the active pillars 330, the channel region 331 may be set in an undoped state in which the channel region 331 is not doped with an impurity. For example, the channel region 331 may be formed of an intrinsic semiconductor. On the other hand, the channel region 331 in each of the active pillars 330 may be doped with an impurity, and have the same conductivity type as the floating diffusion region 332. At this time, the channel region 331 may have an impurity doping concentration lower than the floating diffusion region 332. As the channel region 331 is undoped or doped with an impurity having the same conductivity as the floating diffusion region 332, it is possible to prevent the occurrence of leakage current in a state where the transfer transistor Tx is turned off. That is, the occurrence of noise may be prevented to improve the SNR characteristics.

The unit pixel of the image sensor in accordance with the first embodiment may prevent the occurrence of leakage current in a turn-off state of the transfer transistor Tx through the CD and the doping state of the channel region 331 in each of the active pillars 330, thereby improving the SNR characteristics of the image sensor.

Hereafter, an image sensor in accordance with a second embodiment will be described with reference to FIGS. 5 and 6. In the second embodiment, the same components as those of the first embodiment are represented by like reference numerals, and the detailed descriptions thereof are omitted herein. That is, the following descriptions will be focused on differences between the and second embodiments.

Figure 5:
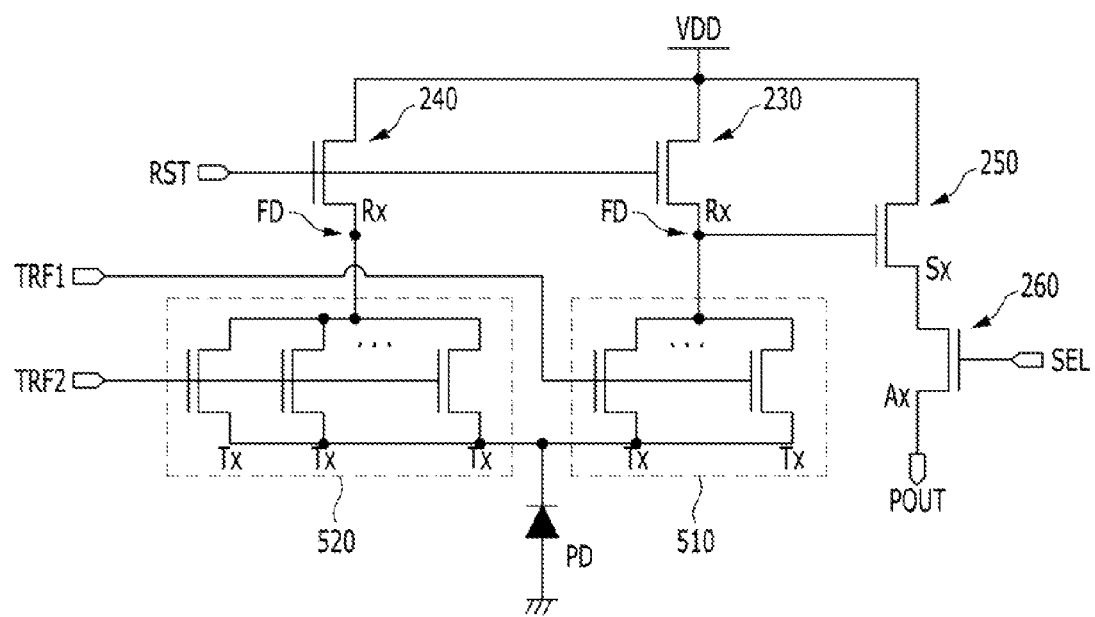
FIG. 5 is an equivalent circuit diagram illustrating a unit pixel of an image sensor in accordance with a second embodiment.

FIG. 5 is an equivalent circuit diagram illustrating a unit pixel of the image sensor in accordance with the second embodiment. FIG. 6 is a perspective view illustrating the unit pixel of the image sensor in accordance with the second embodiment, including a cross-sectional view thereof.

Figure 6:
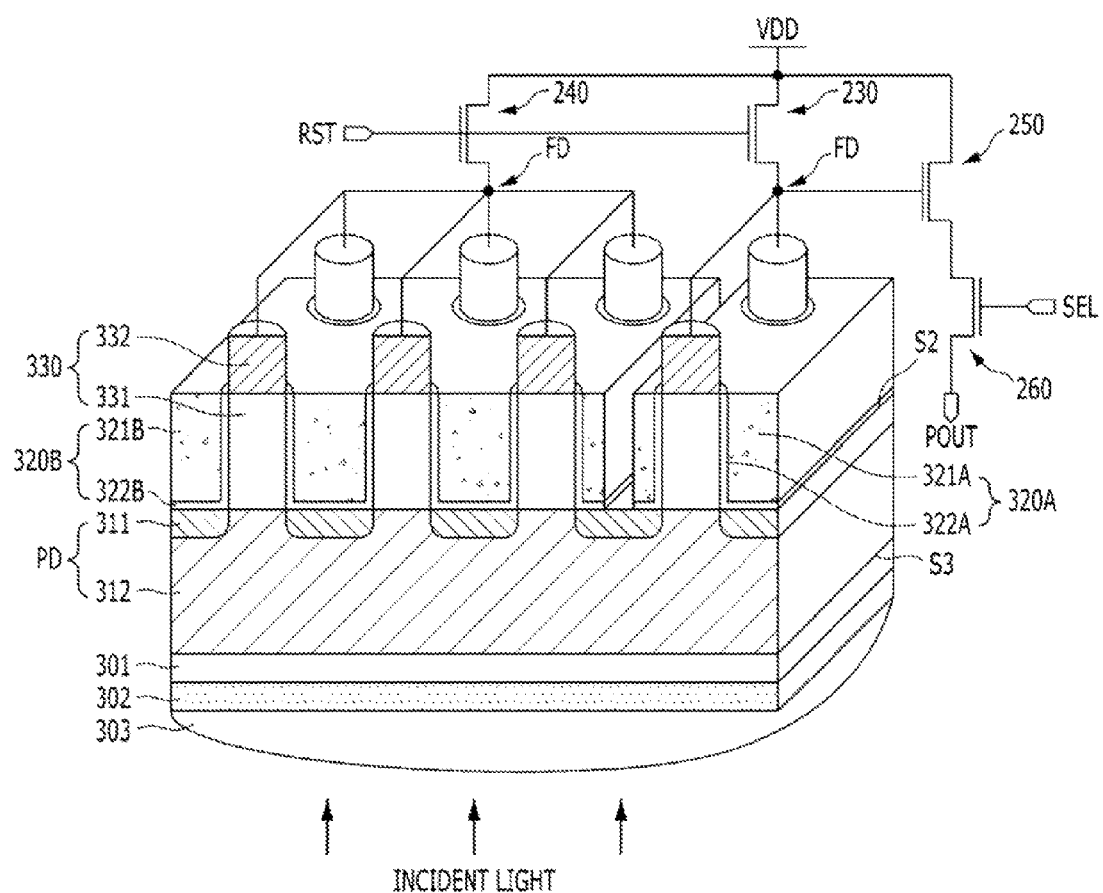
FIG. 6 is a perspective view illustrating a unit pixel of the image sensor in accordance with the second embodiment.

As illustrated in FIGS. 5 and 6, the unit pixel of the image sensor in accordance with the second embodiment is different from the first embodiment in that first and second transfer units 510 and 520 are turned on/off in response to first and second transfer signals TRF1 and TRF2, respectively. Specifically, the first transfer unit 510 may be turned on/off in response to the first transfer signal TRF1, and the second transfer unit 520 may be turned on/off in response to the second transfer signal TRF2. Thus, the plurality of transfer transistors Tx included in the first transfer unit 510 may be configured to share one transfer gate, or the transfer gates of the transfer transistors Tx may be coupled to one conductive line. Furthermore, the plurality of transfer transistors Tx included in the second transfer unit 520 may share one transfer gate, or the transfer gates of the transfer transistors Tx may be coupled to one conductive line.

Subsequently, referring to FIG. 5, a method for driving the unit pixel of the image sensor in accordance with the second embodiment will be described as follows.

First, the first and second transfer signals TRF1 and TRF2 may be applied to the first and second transfer units 510 and 520, respectively, in a state where incident light is blocked, and the reset signal RST may be applied to turn on the first and second reset transistors 230 and 240. As the first and second transfer units 510 and 520 and the first and second reset transistors 230 and 240 are turned on to discharge the floating diffusion nodes FD, the floating diffusion nodes FD may be reset. The first and second transfer signal's TRF1 and TRF2 and the reset signal RST may include a pulse signal for controlling the on/off of a transistor. The first and second transfer signals TRF1 and TRF2 may be equal to each other.

Then, the first and second transfer units 510 and 520 and the first and second reset transistors 230 and 240 may be turned off, and light may be incident on the photoelectric conversion element PD for a predetermined time. The photoelectric conversion element PD may generate an electron-hole pair (EHP), that is, a photocharge using the incident light, and the generated photocharge may be accumulated in the photoelectric conversion element PD. The time during which the photocharge is accumulated in the photoelectric conversion element PD may be referred to as the integration time of the photoelectric conversion element PD.

Even after the floating diffusion nodes FD are reset, the reset signal RST may be continuously applied to maintain the turn-on state of the first and second reset transistors 230 and 240 during the integration time. In this case, it is possible to prevent charges from remaining in the floating diffusion nodes FD while the floating diffusion nodes FD are not reset. Furthermore, it is possible to prevent a change in potential of the floating diffusion node FD during the integration time. For reference, when the potential of the floating diffusion node FD is changed during the integration time, the SNR characteristics may be degraded.

Then, as only the first transfer signal TRF1 is applied in a state the first and second reset transistors 230 and 240 are turned off, the photocharges accumulated in the photoelectric conversion element PD may be transferred to the floating diffusion node FD through the first transfer unit 510 during the integration time. At this time, since the second transfer signal TRF2 is not applied, all of the channel regions of the plurality of transfer transistors Tx in the second transfer unit 520 may maintain a fully depleted state. In proportion to the photocharges transferred to the floating diffusion node FD, a bias inputted to a gate of the source follower transistor 250 may be changed, and a source potential of the source follower transistor 250 may vary. At this time, as only the first transfer signal TRF1 is applied, the source potential of the source follower transistor 250 may vary in response to only the photocharge transferred to the floating diffusion node FD through the first transfer unit 510. Since only the first transfer unit 510, which transfers the photocharge to the floating diffusion node FD that is coupled to the gate of the source follower transistor 250 is turned on, it is possible to improve transfer efficiency of the photocharge and a response speed of the source follower transistor to the photocharge.

When the access transistor 260 is turned on in response to a select signal SEL in a state in which the source potential of the source follower transistor 250 varies, a pixel signal POUT may be outputted. The select signal SEL may include a pulse signal for controlling turn on/off of a transistor.

In the above-described image sensor in accordance with the second embodiment, each of the first and second transfer units 510 and 520 may include one or more transfer transistors Tx coupled in parallel to each other, thereby improving the transfer efficiency of the photocharge generated by the photoelectric conversion element PD.

Furthermore, as the source follower transistor 250 is coupled only to the floating diffusion node FD that is coupled to the first transfer unit 510, the number of transfer transistors Tx included in the first transfer unit 510 may be adjusted to improve the required sensitivity and SNR of the image sensor.

Furthermore, since the first and second transfer units 510 and 520 operate in response to the transfer signals TRF1 and TRF2, respectively, power consumption can be reduced while various operation characteristics are secured.

Then, referring to FIG. 6, a structure of an image sensor having the equivalent circuit will be described.

The unit pixel of the image sensor in accordance with the second embodiment may include a photoelectric conversion element PD, a first transfer gate 320A, a second transfer gate 320B, a plurality of active pillars 330, a first reset transistor 230, a second reset transistor 240, and a source follower transistor 250. The first and second transfer gates 320A and 320B may be formed over the photoelectric conversion element PD. The plurality of active pillars 330 may be electrically coupled to the photoelectric conversion element PD by penetrating the first and second transfer gates 320A and 320B. The plurality of active pillars 330 may be divided into a first group, including one or more active pillars 330 among the plurality of active pillars 330, and a second group, which is different from the first group. The first reset transistor 230 may be electrically coupled to the first group of the plurality of active pillars 330. The second reset transistor 240 may be electrically coupled to the second group of the plurality of active pillars 330. The source follower transistor 250 may have a gate electrically coupled to the first group of the active pillars 330. The unit pixel of the image sensor may further include a color filter layer 302 formed over an incident surface S3 through which incident light is introduced into the photoelectric conversion element PD, and a micro lens 303 formed on the color filter layer 302.

The second embodiment is different from the first embodiment in that the transfer gate is separated into the first transfer gate 320A, including a first gate electrode 321A surrounding the first group of the active pillars 330 and the second transfer gate 320B, including a second gate electrode 321B surrounding the second group of the active pillars 330. Specifically, the first transfer gate 320A may include the first gate electrode 321A and a first charge blocking layer 322A, and the second transfer gate 320B may include the second gate electrode 321B and a second charge blocking layer 322B. The first gate electrode 321A may surround all sidewalls of the first group of the active pillars 330, coupled to the first reset transistor 230, among the plurality of active pillars 330, over the photoelectric conversion element. PD. The second gate electrode 321B may surround all sidewalls of the second group of the active pillars 330 that are coupled to the second reset transistor 240 among the plurality of active pillars 330. The first charge blocking layer 322A may be interposed between the first gate electrode 321A and the photoelectric conversion element PD, and between the first gate electrode 321A and the first group of the active pillars 330. The second charge blocking layer 322B may be interposed between the second gate electrode 321B and the photoelectric conversion element PD, and between the second gate electrode 321B and the second group of the active pillars 330. The transfer transistor Tx including the first group of the active pillars 330, which is surrounded by the first gate electrode 321A, may be turned on/off in response to the first transfer signal TRF1, and the transfer transistor Tx including the second group of the active pillars 330, which is surrounded by the second gate electrode 321S, may be turned on/off in response to the second transfer signal TRF2. The first and second gate electrodes 321A and 321S may include a metallic material and the first and second charge blocking layers 322A and 322S may include an insulating material.

The unit pixel of the image sensor in accordance with the second embodiment prevent the occurrence of leakage current in a turn-off state of the transfer transistor Tx through the CD and the doping state of the channel region 331 in each of the active pillars 330, thereby improving the SNR characteristics of the image sensor.

Figure 7:
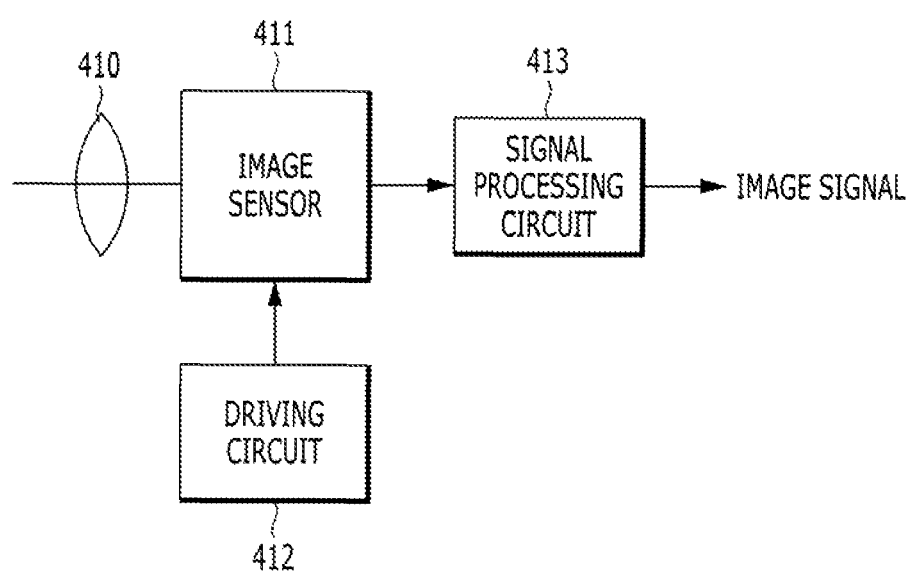
FIG. 7 is a block diagram illustrating an electronic device in accordance with an embodiment.

The image sensors in accordance with the first and second embodiments may be applied to various electronic devices. Hereafter, referring to FIG. 7, an electronic device including an image sensor in accordance with an embodiment will be described. FIG. 7 illustrates a digital still camera capable of taking a still image.

FIG. 7 is a block diagram illustrating an electronic device in accordance with an embodiment.

As illustrated in FIG. 7, the electronic device in accordance with the embodiment may include an optical lens 410, an image sensor 411, a driving circuit 412, and a signal processing circuit 413. The image sensor 411 may be configured according to the first and second embodiments of the present invention.

The optical lens 410 may focus light incident from an object onto an imaging surface of the image sensor 411. Thus, a charge corresponding to the light signal may be accumulated in the image sensor 411. The driving circuit 412 may supply a transfer operation signal to the image sensor 411. The signal transmission of the image sensor 411 may be performed in response to a driving signal or timing signal supplied from the driving circuit 412. The signal processing circuit 413 may process various image signals. The processed image signals may be stored in a memory medium such as a memory or outputted to a monitor.

In accordance with the embodiments of the present invention, as each of the first and second transfer units includes one or more transfer transistors coupled in parallel, the image sensor may improve transfer efficiency of photocharges generated by the photoelectric conversion element.

Furthermore, as the source follower transistor is coupled to the floating diffusion node that is coupled to the first transfer unit, the sensitivity and SNR characteristics of the image sensor may be easily improved.

Furthermore, the image sensor may prevent the occurrence of leakage current in a turn-off state of the transfer transistor through the CD and the doping state of the channel region in each of the active pillars, thereby improving SNR characteristics.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
a photoelectric conversion element;
a transfer gate formed over the photoelectric conversion element;
a plurality of active pillars electrically coupled to the photoelectric conversion element by penetrating the transfer gate;
a reset transistor coupled to the plurality of active pillars; and
a source follower transistor having a gate electrically coupled to one or more active pillars among the plurality of active pillars.

2. The image sensor of claim 1, further comprising:
a color filter layer formed over an incident surface through which incident light is introduced into the photoelectric conversion element; and
a micro lens formed over the color filter.

3. The image sensor of claim 1, wherein the transfer gate comprises:
a gate electrode formed over the photoelectric conversion element; and
a charge blocking layer interposed between the gate electrode and the photoelectric conversion element and between the gate electrode and the plurality of active pillars.

4. The image sensor of claim 3, wherein the gate electrode surrounds all sidewalls of the plurality of active pillars.

5. The image sensor of claim 3, wherein the gate electrode comprises:
a first gate electrode surrounding all sidewalls of a first group of the plurality of active pillars, wherein the first group includes the one or more active pillars coupled to the gate of the source follower transistor; and
a second gate electrode surrounding all sidewalls of a second group of the plurality of active pillars, which is different from the first group.

6. The image sensor of claim 1, wherein the transfer gate is formed over a surface opposite to an incident surface through which incident light is introduced into the photoelectric conversion element.

7. The image sensor of claim 1, wherein the reset transistor comprises:
a first reset transistor electrically coupled to a first group of the plurality of active pillars, wherein the first group includes the one or more active pillars coupled to the gate of the source follower transistor; and
a second reset transistor electrically coupled to a second group of the plurality of active pillars, which is different from the first group.

8. The image sensor of claim 1, wherein each of the active pillars has a critical dimension at which the active pillar is fully depleted in an equilibrium state.

9. The image sensor of claim 1, wherein each of the active pillars comprises:
a channel region coupled to the photoelectric conversion element, and surrounded by the transfer gate; and
a floating diffusion region coupled to the channel region, and protruding over the transfer gate.

10. The image sensor of claim 9, wherein the channel region has an undoped state in which the channel region is not doped with an impurity.

11. The image sensor of claim 9, wherein the channel region has a doped state in which the channel region is doped with an impurity, has a same conductivity type as the floating diffusion region, and has a lower impurity doping concentration than the floating diffusion region.

12. The image sensor of claim 1, wherein the photoelectric conversion element comprises first and second impurity regions that vertically overlap each other and have different conductivity types, and the first impurity region is electrically coupled to the plurality of active pillars.

13. An image sensor comprising:
a photoelectric conversion element;
a plurality of active pillars formed over the photoelectric conversion element, and electrically coupled to the photoelectric conversion element;
a transfer gate formed over the photoelectric conversion element to surround the plurality of active pillars;
a first reset transistor electrically coupled to a first group of the plurality of active pillars; and
a second reset transistor electrically coupled to a second group of the plurality of active pillars, which is different from the first group.

14. The image sensor of claim 13, further comprising:
a source follower transistor having a gate electrically coupled to the first group of the active pillars.

15. The image sensor of claim 13, wherein the transfer gate comprises:
a gate electrode formed over the photoelectric conversion element; and
a charge blocking layer interposed between the gate electrode and the photoelectric conversion element and between the gate electrode and the plurality of active pillars.

16. The image sensor of claim 15, wherein the gate electrode surrounds all sidewalls of the plurality of active pillars.

17. The image sensor of claim 15, wherein the gate electrode comprises:
a first gate electrode surrounding all sidewalls of the first group of the plurality of active pillars; and
a second gate electrode surrounding all sidewalls of the second group of the plurality of active pillars.

18. The image sensor of claim 13, wherein the transfer gate is formed over a surface opposite to an incident surface through which incident light is introduced into the photoelectric conversion element.

19. The image sensor of claim 13, wherein each of the plurality of active pillars has a critical dimension at which the active pillar is fully depleted in an equilibrium state.

20. The image sensor of claim 13, wherein each of the plurality of active pillars comprises:
a channel region coupled to the photoelectric conversion element, and surrounded by the transfer gate; and
a floating diffusion region coupled to the channel region, and protruding over the transfer gate.

21. The image sensor of claim 20, wherein the channel region has an undoped state in which the channel region is not doped with an impurity.

22. The image sensor of claim 20, wherein the channel region has a doped state in which the channel region is doped with an impurity, has substantially the same conductivity as the floating diffusion region, and has a lower impurity doping concentration than the floating diffusion region.

23. The image sensor of claim 13, wherein the photoelectric conversion element comprises first and second impurity regions that vertically overlap each other and have different conductivity types, and the first impurity region is electrically coupled to the plurality of active pillars.

24. An image sensor comprising:
a photoelectric conversion element;
first and second transfer units sharing the photoelectric conversion element, and each including one or more transfer transistors coupled in parallel;
a first reset transistor coupled to the first transfer unit;
a source follower transistor having a gate coupled to a floating diffusion node between the first transfer unit and the first reset transistor; and
a second reset transistor coupled to the second transfer unit,
wherein the first and second transfer units are turned on/off in response to a same transfer signal, and the first and second reset transistors are turned on/off in response to a same reset signal.

25. The image sensor of claim 24, wherein the first and second transfer units are turned on/off in response to a different transfer signal, and the first and second reset transistors are turned on/off in response to a same reset signal.

26. An electronic device comprising:
an optical lens;
an image sensor having a plurality of unit pixels; and
a signal processing circuit suitable for processing an output signal from the image sensor,
wherein each of the plurality of unit pixels comprises:
a photoelectric conversion element;
a transfer gate formed over the photoelectric conversion element;
a plurality of active pillars electrically coupled to the photoelectric conversion element by penetrating the transfer gate;
a reset transistor coupled to the plurality of active pillars; and
a source follower transistor having a gate electrically coupled to one or more active pillars among the plurality of active pillars.

* * * * *

UNITED STATES PATENT AND TRADEMARK OFFICE
CERTIFICATE OF CORRECTION

PATENT NO.        : 9,704,911 B2
APPLICATION NO.   : 14/609152
DATED             : July 11, 2017
INVENTOR(S)       : Dongyean Oh Page 1 of 1

It is certified that error appears in the above-identified patent and that said Letters Patent is hereby corrected as shown below:

On the Title Page

Item (56) References Cited change the Foreign Patent Documents section as follows:
KR    1020120125600    11/2012

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*